United States Patent
Wang

(10) Patent No.: US 11,785,755 B2
(45) Date of Patent: Oct. 10, 2023

(54) STATIC RANDOM-ACCESS MEMORY AND FABRICATION METHOD THEREOF

(71) Applicants: Semiconductor Manufacturing International (Beijing) Corporation, Beijing (CN); Semiconductor Manufacturing International (Shanghai) Corporation, Shanghai (CN)

(72) Inventor: Nan Wang, Shanghai (CN)

(73) Assignees: Semiconductor Manufacturing International (Beijing) Corporation, Beijing (CN); Semiconductor Manufacturing International (Shanghai) Corporation, Shanghai (CN)

(*) Notice: Subject to any disclaimer, the term of this patent is extended or adjusted under 35 U.S.C. 154(b) by 216 days.

(21) Appl. No.: 17/355,521

(22) Filed: Jun. 23, 2021

(65) Prior Publication Data
US 2021/0320108 A1   Oct. 14, 2021

Related U.S. Application Data

(62) Division of application No. 16/231,794, filed on Dec. 24, 2018, now Pat. No. 11,088,149.

(30) Foreign Application Priority Data

Dec. 28, 2017  (CN) .......................... 201711460702.8

(51) Int. Cl.
| | | |
|---|---|---|
| H01L 27/11 | (2006.01) | |
| H10B 10/00 | (2023.01) | |
| H01L 21/308 | (2006.01) | |
| H01L 21/265 | (2006.01) | |
| H01L 21/3115 | (2006.01) | |
| H01L 21/311 | (2006.01) | |

(52) U.S. Cl.
CPC ....... *H10B 10/12* (2023.02); *H01L 21/26506* (2013.01); *H01L 21/3086* (2013.01); *H01L 21/31111* (2013.01); *H01L 21/31155* (2013.01)

(58) Field of Classification Search
CPC ........................... H10B 10/12; H01L 27/1104
See application file for complete search history.

(56) References Cited

U.S. PATENT DOCUMENTS

| | | | |
|---|---|---|---|
| 2014/0131813 A1* | 5/2014 | Liaw | .................. H01L 27/0207 438/689 |
| 2015/0206890 A1 | 7/2015 | Liaw | |
| 2015/0370950 A1 | 12/2015 | Kawa et al. | |
| 2017/0278870 A1* | 9/2017 | Cheng | ................. H01L 21/3081 |
| 2019/0326300 A1 | 10/2019 | Liaw | |

* cited by examiner

*Primary Examiner* — Walter H Swanson
(74) *Attorney, Agent, or Firm* — Anova Law Group, PLLC

(57) ABSTRACT

A static random-access memory device is provided. The static random-access memory device includes a substrate with at least one first region; first fins on a surface of the substrate, and second initial fins on the surface of the substrate. A width of the second initial fins is different from a width of the first fins. A portion of the first fins is used to form pass-gate transistors, and another portion of the first fins and the second initial fins are used to form pull-down transistors.

11 Claims, 4 Drawing Sheets

STATIC RANDOM-ACCESS MEMORY AND FABRICATION METHOD THEREOF

CROSS-REFERENCES TO RELATED APPLICATION

This application is a divisional of U.S. patent application Ser. No. 16/231,794, filed on Dec. 24, 2018, which claims the priority of Chinese Patent Application No. 201711460702.8, filed on Dec. 28, 2017, the content of which is incorporated herein by reference in its entirety.

TECHNICAL FIELD

The present disclosure generally relates to the field of semiconductor technologies and, more particularly, relates to a static random-access memory and its fabrication method.

BACKGROUND

As digital integrated circuit (IC) technologies continuously develop, on-chip memories become important components in a digital system. A static random-access memory (SRAM) has a low power consumption and a high operation speed. Correspondingly, the SRAM becomes an important component of the on-chip memories. An SRAM can preserve data as long as the SRAM is power supplied. There is no need to keep refreshing the SRAM.

A basic structure of an SRAM usually includes six transistors: two pull-up transistors (PU), two pull-down transistors (PD), and two pass-gate transistors (PG). In a neural process of an SRAM, a β ratio (a current ratio $I_{pd}/I_{pg}$) has to be large enough to achieve a high enough static-noise margin (SNM). In the meanwhile, a large enough γ ratio (a current ratio $I_{pg}/I_{pu}$) is required for a good writability. Different requirements on a performance of the pass-gate transistors cause a conflict between the writability and the read stability of the SRAM.

SUMMARY

One aspect of the present disclosure provides a fabrication method of an SRAM. The method includes: forming an initial substrate including at least one first region; and removing a portion of the initial substrate in the first region, to forming a substrate, first fins on the substrate, and second initial fins on the substrate. A width of the second initial fins is different from a width of the first fins. A portion of the first fins is used to form pass-gate transistors; and another portion of the first fins and the second initial fins are used to form pull-down transistors.

Another aspect of the present disclosure provides an SRAM. The SRAM includes: a substrate with at least one first region; first fins on a surface of the substrate; and second initial fins on the surface of the substrate. A width of the second initial fins is different from a width of the first fins. A portion of the first fins is used to form pass-gate transistors; and another portion of the first fins and the second initial fins are used to form pull-down transistors.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
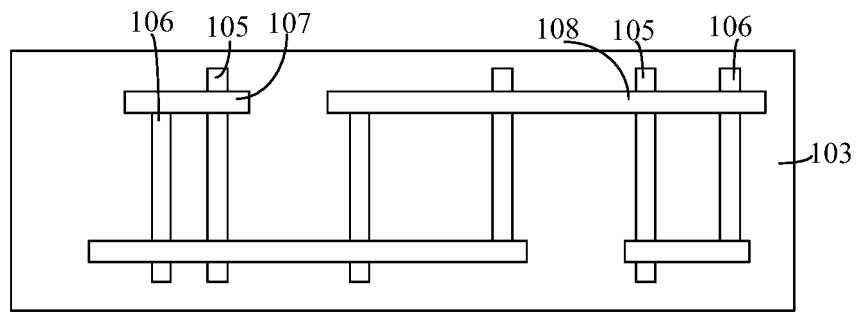
FIG. 1 illustrates a static random-access memory.

FIG. 1 illustrates a static random-access memory. The static random-access memory may include: a substrate 100, first fins 105 on a surface of the substrate 100, second fins 106 on the surface of the substrate 100, first gate structures 107 across the first fins 105, second gate structures 108 across the first fins 105 and the second fins 106, first source-drain doped regions in the first fins 105 on sides of each first gate structure 107, and second source-drain doped regions in the first fins 105 and in the second fins 106 on sides of each second gate structure 108.

A same pattern process may be used to form the first fins 105 and the second fins 106. Correspondingly, a difference between a width of the first fins 105 and a width of the second fins 106 may be small. The first fins 105, the first gate structures 107, and the first source-drain doped regions may form pass-gate transistors. The first fins 105, the second fins 106, the second gate structures 108, and the second source-drain doped regions may form pull-down transistors. The pass-gate transistors may have a first channel width and the first channel width may be the width of the first fins 105. The pull-down transistors may have a second channel width and the second channel width may be a sum of the width of the first fins 105 and the width of the second fins 106. Since the first fins 105 and the second fins 106 may have the same width, a ratio between the first channel width and the second channel width may be 1:2. A saturated driving current of an SRAM may be proportional to a channel width. The saturated driving current may be larger when the channel width is larger. Correspondingly, a ratio between a saturated driving current of the pass-gate transistors and a saturated driving current of the pull-down transistors may be 1:2. The ratio between the saturated driving current of the pass-gate transistors and the saturated driving current of the pull-down transistors may be too simple to meet a largely diverse requirement of the static random-access memory.

The present disclosure provides a fabricating method for forming a static random-access memory. The method may include: providing an initial substrate at least including a first region; and forming a substrate, first fins on a surface of the substrate, and second initial fins on the surface of the substrate, by removing a portion of the initial substrate in the first region. The first fins and the second initial fins may have a different width. The first fins may be used to form pass-gate transistors, and a portion of the first fins and the second initial fins may be used to form pull-down transistors. The formed static random-access memory may have a good performance.

Figure 9:
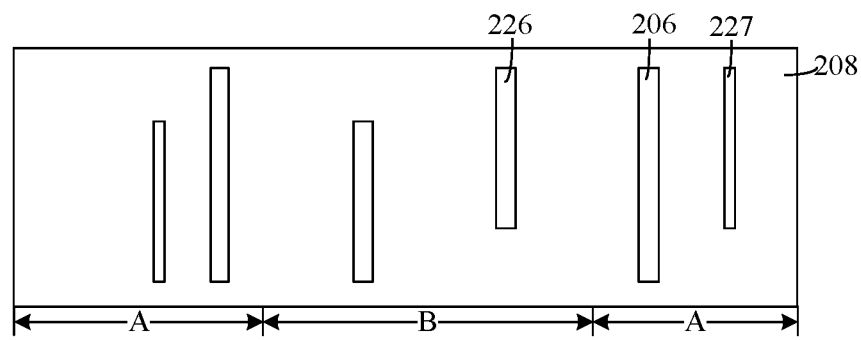
Figure 10:
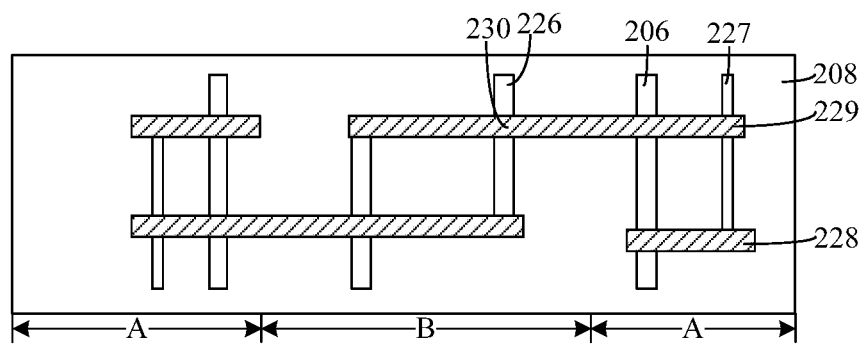
Figure 11:
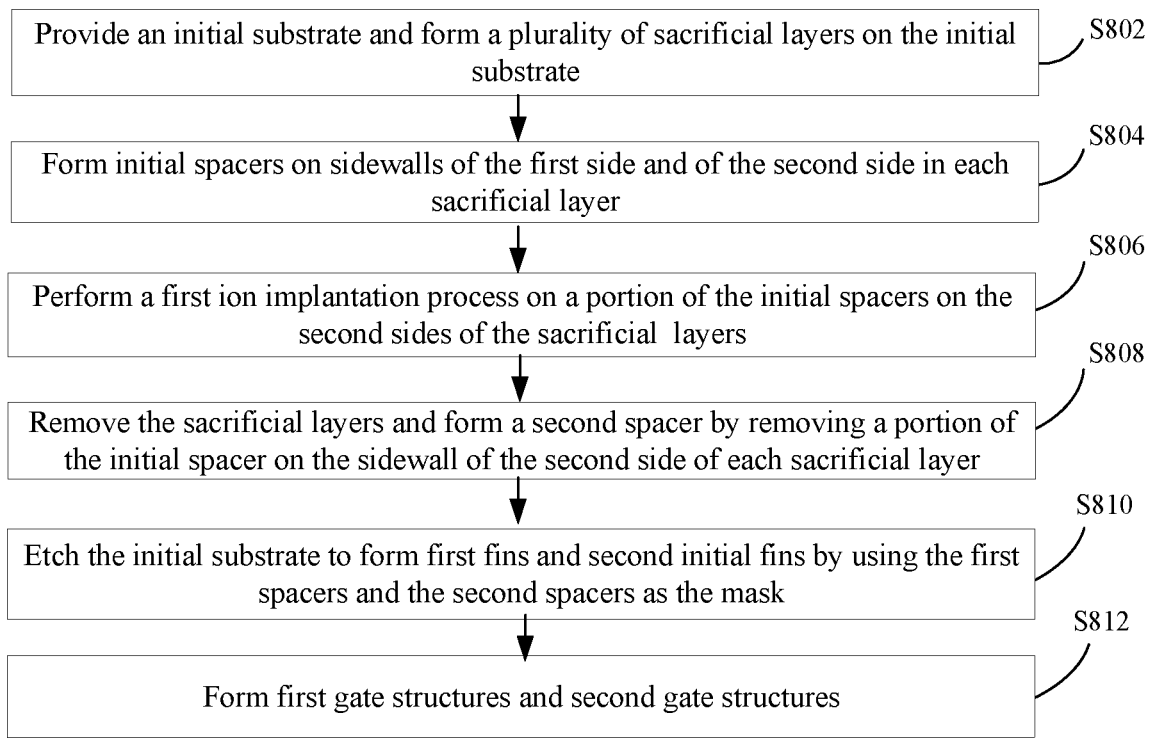
FIG. 11 illustrates an exemplary method for forming an exemplary static random-access memory according to various disclosed embodiments of the present disclosure.

FIGS. 2-10 illustrate semiconductor structures corresponding to certain stages for forming an exemplary static random-access memory according to various disclosed embodiments of the present disclosure; and FIG. 11 illustrates an exemplary method for forming an exemplary static random-access memory according to various disclosed embodiments of the present disclosure.

Figure 2:
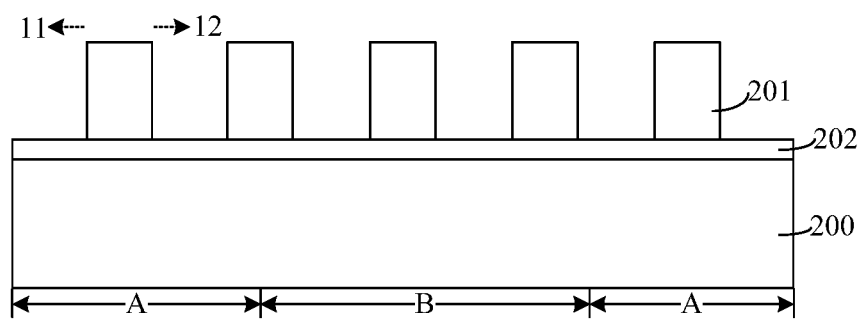
FIGS. 2-10 illustrate semiconductor structures corresponding to certain stages for forming an exemplary static random-access memory according to various disclosed embodiments of the present disclosure.

As illustrated in FIG. 2, an initial substrate 200 may be provided. The initial substrate 200 may at least include a first region A (e.g. Step S802 in FIG. 11). A plurality of sacrificial layers 201 may be formed on a surface of the initial substrate 200 in the first region A. Each of the plurality of sacrificial layers 201 may have a first side 11 and a second side 12. The first side 11 and the second side 12 of the sacrificial layer 201 may be opposite to each other in a direction perpendicular to sidewalls of the sacrificial layers 201.

In one embodiment, the initial substrate 200 may be a silicon substrate. In other embodiments, the initial substrate 200 may be a semiconductor substrate including a germanium substrate, a SiGe substrate, a silicon-on-insulator substrate, a germanium-on-insulator substrate, and a SiGe-on-insulator substrate.

In some embodiments, the initial substrate 200 may include semiconductor devices such as metal-oxide-semiconductor (MOS) transistors.

In one embodiment, before forming the sacrificial layers 201, the method may further include forming a stop layer 202 on the surface of the initial substrate 200. In other embodiments, the sacrificial layers 201 may be formed directly on the surface of the initial substrate 200 without forming the stop layer 202.

The stop layer 202 may be used as a stop layer for forming the sacrificial layers 201 subsequently, to protect the top surface of the initial substrate 200.

In one embodiment, the stop layer 202 may be made of silicon oxide. In other embodiments, the stop layer 202 may be made of a material including SiN, SICN, and/or SiCO.

The sacrificial layers 201 may be formed by: forming a sacrificial film on a top surface of the stop layer 202; forming a first mask layer on a top surface of the sacrificial film to expose a portion of the top surface of the sacrificial film; and etching the sacrificial film by using the first mask layer as a mask until exposing the top surface of the stop layer 202, to form the sacrificial layers 201.

In one embodiment, the sacrificial film may be made of nitrogen-free carbon (NFC). In other embodiment, the sacrificial film may be made of a material including amorphous carbon layer (ACL) and/or amorphous silicon (α-Si).

The sacrificial film may be formed by a fluid chemical vapor deposition process, and may be used to form the sacrificial layers 201 subsequently.

The first mask layer may be made of a material including SiN and may be used as a mask when forming the sacrificial layers 201.

The sacrificial film may be etched by a dry etching process, a wet etching process, or a combination thereof.

Each sacrificial layer 201 may include the first side 11 and the second side 12. The first side 11 of each sacrificial layer 201 may be used to form a first spacer, and the second side 12 of each sacrificial layer 201 may be used to form a second spacer.

The first region A may be used to form the pass-gate transistors and the pull-down transistors in the static random-access memory.

In one embodiment, the static random-access memory may have a 6T structure, and may include two pass-gate transistors and two pull-down transistors. Correspondingly, the initial substrate 200 may have two first regions A, and each first region A may include one pass-gate transistor and one pull-down transistor.

In one embodiment, the initial substrate 200 may further include second regions B. The second regions B may be used to form pull-up transistors. A quantity of the pull-up transistors may be 2.

Figure 3:
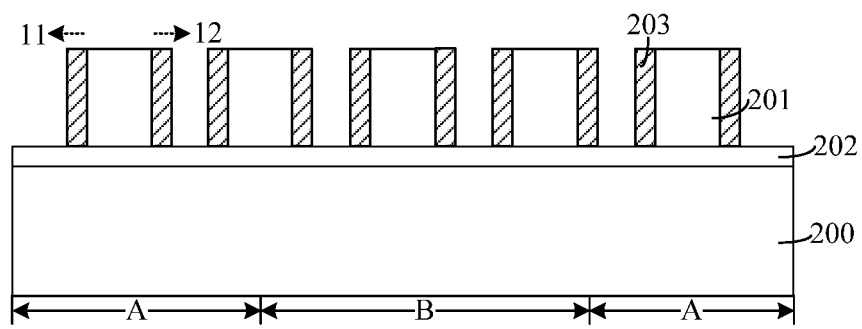

As illustrated in FIG. 3, initial spacers 203 may be formed on a sidewall of the first side 11 and a sidewall of the second side 12 in each sacrificial layer 201 (e.g. Step S804 in FIG. 11).

The initial spacers 203 may be formed by: forming a spacer film on a top of the stop layer 202, on sidewalls of the sacrificial layers 201, and on top surfaces of the sacrificial layers 201; and forming the initial spacers 203 on the sidewall of the first side 11 and of the second side 12 in each sacrificial layer 201, by removing a portion of the spacer film on the top of the stop layer 202 and on the top surfaces of the sacrificial layers 201.

In one embodiment, the spacer film may be made of SiN, and the initial spacers 203 may be made of SiN. In other embodiments, the spacer film may be made of a material including silicon-oxide compound and/or titanium-oxide compound, and the initial spacer 203 may be made of a material including silicon-oxide compound and/or titanium-oxide compound.

The spacer film may be formed by an atomic layer deposition process. A thickness of the spacer film formed by the atomic layer deposition process may have a high uniformity. The spacer film may be used to form the initial spacers 203, and correspondingly, a difference of a size of the initial spacers 203 along a direction perpendicular to the sidewalls of the sacrificial layers 201 may be small. The initial spacers 203 may be used to form first spacers and second spacers.

The portion of the spacer film on the stop layer 201 and on the top surfaces of the sacrificial layers 201 may be removed by a dry etching process, a wet etching process, or a combination thereof.

Figure 4:
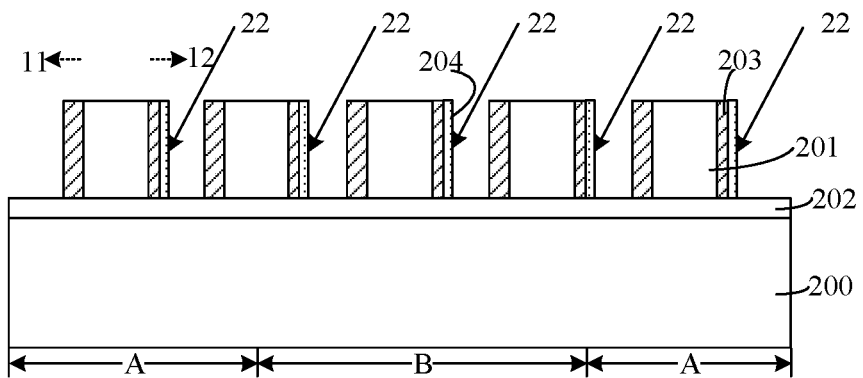

As illustrated in FIG. 4, a first ion implantation process 22 may be performed on a portion of the initial spacers 203 on the second sides 12 of the sacrificial layers 201 (e.g., Step S806 in FIG. 11).

The first ion implantation process 22 may be performed using first implanting ions including germanium ions and/or inert ions. The inert ions may include, for example, argon ions.

In one embodiment, the first ion implantation process 22 may be performed with first implanting ions including germanium ions, an implantation energy of about 5 keV to about 20 keV, an implantation angle of about 5 degree to about 45 degree, and an implantation dose of about 5E13 atom number/cm$^2$ to about 1E15 atom number/cm$^2$.

In one embodiment, a portion 204 of the initial spacers 203 where the first ion implantation process 22 is performed may have an etch selection ration different from an etch selection ratio of another portion of the initial spacers 203 where the first ion implantation process 22 is not performed. Correspondingly, when removing the portion 204 of the initial spacers 203 where the first ion implantation process 22 is performed, another portion of the initial spacers 203 where the first ion implantation process is not performed may be preserved. As illustrated in FIG. 4, the remaining initial spacer 203 on the sidewall of the second side 12 of each sacrificial layer may be used as a second spacer 203*b*, while the remaining initial spacer 203 on the sidewall of the first side 11 in each sacrificial layer 201 may be preserved to be used as a first spacer 203*a*. The first spacer 203*a* may have a size larger than a size of the second spacer 203*b* along a direction of the sidewalls of the sacrificial layer 201.

Alternatively, a second ion implantation process may be performed on a portion of the initial spacers 203 on the first sides 11 of the sacrificial layers 201. A portion of the initial spacers 203 where the second ion implantation process is performed may have an etch selection ration different from an etch selection ratio of another portion of the initial spacers 203 where the second ion implantation process is not performed. Subsequently, the portion of the initial spacers 203 on the sidewalls of the first sides 11 of the sacrificial layers 201 where the second ion implantation process is performed may be removed to form the first spacers, and the portion of the initial spacers 203 on the sidewalls of the second sides 12 of the sacrificial layers 201 may not be removed and may be used as the second spacers. The first spacer may have a size smaller than a size of the second spacer along a direction of the sidewalls of the sacrificial layer 201.

Figure 5:
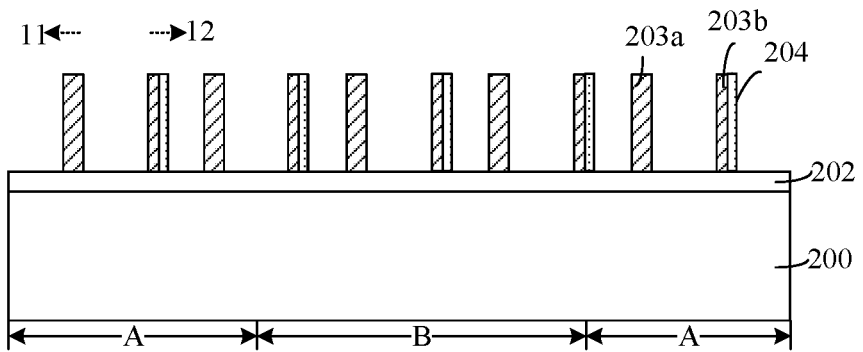

As illustrated in FIG. 5, the sacrificial layers 201 may be removed after performing the first ion implantation process 22 at the second sides 12 of the sacrificial layers 201 (e.g. Step S808 in FIG. 11).

The sacrificial layers 201 may be removed by a dry etching process, a wet etching process, or a combination thereof.

Figure 6:
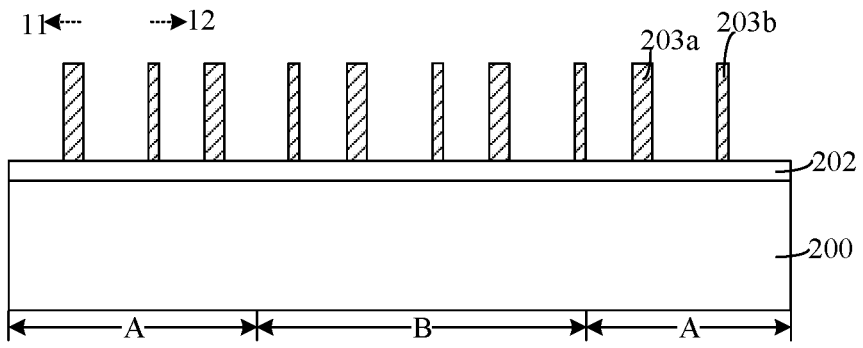

As illustrated in FIG. 6, after removing the sacrificial layers 201, the portion 204 of the initial spacer 203 on the sidewall of the second side 12 of each sacrificial layer 201 where the first ion implantation process 22 is performed may be removed to form the second spacer 203*b* (e.g. Step S808 in FIG. 11).

The portion 204 of the initial spacer 203 on the sidewall of the second side 12 of each sacrificial layer 201 where the first ion implantation process 22 is performed may be removed by a dry etching process, a wet etching process, or a combination thereof.

In one embodiment, the first ion implantation process 22 may be performed with germanium ions as the first implantation ions. The portion 204 of the initial spacer 203 on the sidewall of the second side 12 of each sacrificial layer 201 where the first ion implantation process 22 is performed may be removed by the wet etching process. The wet etching process may be performed with an etchant including hydrochloric acid and a mass ratio of the etchant of about 0.1% to about 5%.

In the fabrication method provided by various embodiments of the present disclosure, the portion 204 of the initial spacers 203 where the first ion implantation process 22 is performed may have defects inside and may be removed easily. The etchant may have a high etching selection ratio for the portion of the initial spacers 203 where the first ion implantation process is performed and for another portion of the initial spacers 203 where the first ion implantation process is not performed. When removing the portion 204 of the initial spacers 203 where the first ion implantation process 22 is performed, another portion of the initial spacers 203 where the first ion implantation process 22 is not performed may be preserved. The remaining portion of the initial spacer 203 on the sidewall of the second side 12 of each sacrificial layer may be used as the second spacer 203*b*, while the initial spacer 203 on the sidewall of the first side 11 in each sacrificial layer 201 may be preserved to be used as the first spacer 203*a*.

The second spacers 203*b* may be made of a material including SiN.

The first spacers 203*a* may be used as a mask for forming the first fins, and the second spacers 203*b* may be used as a mask for forming the second initial fins.

Figure 7:
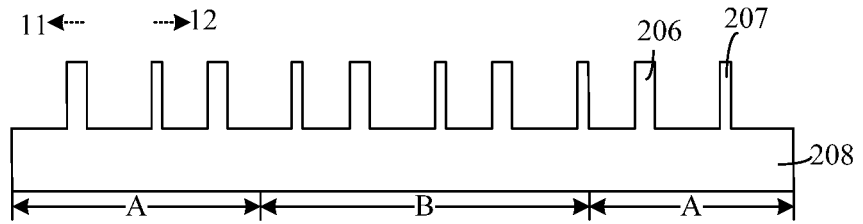
Figure 8:
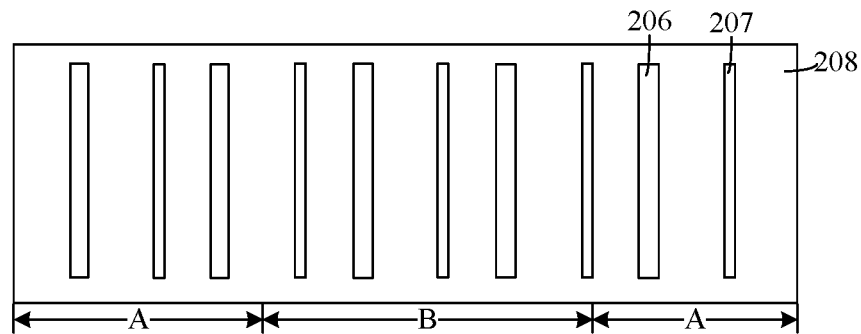

As illustrated in FIG. 7 and FIG. 8 which is a top view of FIG. 7, the initial substrate 200 may be etched by using the first spacers 203*a* as a mask, to form first fins 206. The first fins 206 may be used to form the pass-gate transistors (e.g. Step S810 in FIG. 11). The initial substrate 200 may be etched by using the second spacers 203*b* as a mask, to form second initial fins 207. The second initial fins 207 may have a width different from a width of the first fins 206. The first fins 206 and the second initial fins 207 may be used to form the pull-down transistors.

In one embodiment, the first fins 206 and the second initial fins 207 may be formed simultaneously. In other embodiments, the first fins 206 may be formed before or after forming the second initial fins 207.

In one embodiment, the fabrication method may further include forming a substrate 208. The substrate 208 may include the first fins 206 and the second initial fins 207.

A first portion of the first fins 206 in the first regions A may be used as fins of the pass-gate transistors, and a second portion of the first fins 206 in the second regions B may be used to form third fins. The third fins may be used as fins of the pull-up transistors. A first portion of the second initial fins 207 in the first regions A may be used to form second fins. The second fins and the first portion of the first fins 206 in the first regions A may be used to form the pull-down transistors.

As illustrated in FIG. 9, a third portion of the first fins 206 in the first regions A and a fourth portion of the first fins 206 in the second regions B may be removed to form the third fins 226. A second portion of the second initial fins 207 in the first regions A and in the second regions B may be removed, to form the second fins 227 on the substrate 208 in the first regions A.

The third portion of the first fins 206 in the first regions A may be removed by a dry etching process, a wet etching process, or a combination thereof.

After removing the third portion of the first fins 206 in the first regions A, some first fins 206 in the first regions A may be preserved completely. The first fins 206 preserved completely in the first regions A may be used as fins of the pass-gate transistors. The second fins 227 and a portion of the remaining first fins 206 may be used as the fins of the pull-down transistors.

The fourth portion of the first fins 206 in the second regions B may be removed by a dry etching process, a wet etching process, or a combination thereof.

The second portion of the second initial fins 207 in the first regions A and in the second regions B may be removed by a dry etching process, a wet etching process, or a combination thereof.

The third fins 226 may be used as fins of the pull-up transistors.

As illustrated in FIG. 10, first gate structures 228 may be formed to cross the first fins 206 in the first regions A. Second gate structures 229 may be formed to cross the first fins 206 in the first regions A and the second fins 227 (e.g. Step S812 in FIG. 11). Third gate structures 230 may be formed to cross the third fins 226.

Each first gate structure 228 may include a first gate dielectric layer and a first gate electrode layer on the first gate electric layer.

Each second gate structure 228 may include a second gate dielectric layer and a second gate electrode layer on the second gate electric layer.

The first gate dielectric layer and the second dielectric layer may be made of a material including $SiO_2$. The first gate electrode layer and the second gate electrode layer may be made of a material including silicon.

First source-drain doped regions may be formed in the first fins 206 at sides of each first gate structure 228. Second source-drain doped regions may be formed in the first fins 206 and in the second fins 227 at sides of each second gate structure 229.

The first fins 206, the first gate structures 228 and the first source-drain doped regions may form the pass-gate transistors. The first fins 206, the second fins 227, the second gate structures 229 and the second source-drain doped regions may form the pull-down transistors. The pass-gate transistors and the pull-down transistors may be NMOS transistors. The first source-drain doped regions and the second source-drain doped regions may be made of a material including SiC and/or silicon. The first source-drain doped regions and the second source-drain doped regions may include first source-drain ions. The first source-drain ions may be N-type ions including phosphorus ions and/or arsenic ions.

The first fins 206 may have a width different from a width of the second fins 227. The width of the first fins 206 and the width of the second fins 227 may be configured according to actual requirements. A ratio between a width of the fins of the pull-down transistors and a width of the fins of the pass-gate transistors may be flexible. A channel width of the transistor may be the width of the fins, and may be proportional to a saturated current of the transistor. Correspondingly, a ratio between the saturated currents of the pull-down transistors and of the pass-gate transistors may be flexible. Different requirements in the process may be satisfied.

Each third gate structure 230 may include a third gate dielectric layer and a third gate electrode layer on the third gate electric layer.

The third dielectric layer may be made of a material including $SiO_2$. The third gate electrode layer may be made of a material including silicon.

Third source-drain doped regions may be formed in the third fins 226 at sides of each third gate structure 230.

The third fins 226, the third gate structures 230 and the third source-drain doped regions may form the pull-up transistors. The pull-up transistors may be PMOS transistors. The third source-drain doped may be made of a material including SiGe and/or silicon. The third source-drain doped regions may include second source-drain ions. The second source-drain ions may be P-type ions including boron ions.

The present disclosure also provides a static random-access memory formed by the above method. The static random-access memory may include: a substrate 208 including at least one first region A; first fins 206 on the substrate 208 in the first region A; and second initial fins 207 on the substrate 208 in the first region A.

The second initial fins 207 may have a width different from a width of the first fins 206. A portion of the first fins 206 in the first region A may be used to form pass-gate transistors. Another portion of the first fins 206 and the second initial fins 207 may be used to form pull-down transistors.

The width of the first fins 206 may be about 9 nm to about 11 nm.

The width of the second initial fins 207 may be about 8 nm to about 10 nm.

The width of the first fins 206 may be larger than the width of the second initial fins 207; or the width of the first fins 206 may be smaller than the width of the second initial fins 207.

In the present disclosure, a portion of the first fins in the first region may be used to form pass-gate transistors. Another portion of the first fins and the second initial fins may be used to form pull-down transistors. A size of the first fins and a size of the second fins may be configured according to actual requirements. A ratio between a width of the fins of the pull-down transistors and a width of the fins of the pass-gate transistors may be flexible. A channel width of the transistor may be the width of the fins, and may be proportional to a saturated current of the transistor. Correspondingly, a ratio between the saturated currents of the pull-down transistors and of the pass-gate transistors may be flexible. Different requirements in the process may be satisfied.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A static random-access memory device, including:
a substrate with at least one first region;
first fins on a surface of the substrate, and second fins on the surface of the substrate;
wherein:
a width of the second fins is smaller than a width of the first fins, a length of the second fins is smaller than a length of the first fins, and the first fins are located between the second fins;
a portion of the first fins is used to form pass-gate transistors; and
another portion of the first fins and the second fins are used to form pull-down transistors.

2. The device according to claim 1, wherein:
the width of the first fins is about 9 nm to about 11 nm.

3. The device according to claim 1, wherein:
the width of the second fins is about 8 nm to about 10 nm.

4. The device according to claim 1, further including:
first gate structures formed across the first fins; and
second gate structures formed across the first fins and the second fins.

5. The device according to claim 4, further including:
first source-drain doped regions formed in the first fins on sides of each first gate structure; and
second source-drain doped regions formed in the first fins and in the second fins on sides of each second gate structure.

6. The device according to claim 5, wherein:
the first gate structures, the first fins, and the first source-drain doped regions together form the pass-gate transistors; and
the second gate structures, the first fins, the second fins, and the second source-drain doped regions together form the pull-down transistors.

7. The device according to claim 1, wherein:
the substrate further includes second regions between adjacent first regions and the second regions are used to form pull-up transistors, further including:
third fins formed in the second regions;
third gate structure formed across the third fins; and
third source-drain doped regions formed in the third fins on sides of each third gate structure.

8. The device according to claim 7, wherein:
when the static random-access memory device has a 6T structure, the static random-access memory device includes two pull-up transistors, two pull-down transistors, and two pass-gate transistors.

9. The device according to claim 7, wherein a width of the third fins is same as the width of the first fins, and a length of the third fins is smaller than the length of the first fins.

10. The device according to claim 7, wherein the third fins are located between the first fins.

11. The device according to claim 7, wherein one of the first fins is located between one of the second fins and one of the third fins, and a distance between the one of the first fins and the one of the second fins is smaller than a distance between the one of the first fins and the one of the third fins.

* * * * *